(12) United States Patent
Morinaka et al.

(10) Patent No.: US 6,985,182 B1
(45) Date of Patent: Jan. 10, 2006

(54) IMAGING DEVICE WITH VERTICAL CHARGE TRANSFER PATHS HAVING APPROPRIATE LENGTHS AND/OR VENT PORTIONS

(75) Inventors: Yasuhiro Morinaka, Osaka (JP); Hiroyoshi Komobuchi, Kyoto (JP); Takumi Yamaguchi, Kyoto (JP); Sei Suzuki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 897 days.

(21) Appl. No.: 09/717,758

(22) Filed: Nov. 21, 2000

(30) Foreign Application Priority Data

Nov. 22, 1999 (JP) ................................. 11-331221
Sep. 22, 2000 (JP) ............................. 2000-289213

(51) Int. Cl.
    *H04N 5/335* (2006.01)
(52) U.S. Cl. ...................... 348/311; 348/320; 257/240; 257/242
(58) Field of Classification Search ................ 348/311, 348/315, 316, 319, 320, 275; 257/240, 242, 257/243, 229
See application file for complete search history.

(56) References Cited

U.S. PATENT DOCUMENTS

| | | | |
|---|---|---|---|
| 4,575,763 A * | 3/1986 | Elabd | 348/317 |
| 4,647,977 A | 3/1987 | Tower | |
| 4,835,616 A * | 5/1989 | Morcom | 348/317 |
| 5,491,512 A * | 2/1996 | Itakura et al. | 348/321 |
| 5,742,081 A * | 4/1998 | Furumiya | 257/232 |
| 5,748,232 A * | 5/1998 | Konuma | 348/219.1 |
| 5,969,759 A | 10/1999 | Morimoto | |

FOREIGN PATENT DOCUMENTS

| | | | |
|---|---|---|---|
| EP | 0866502 A2 * | 3/1998 | |
| EP | 0 866 502 | 9/1998 | |
| JP | 61994870 A * | 8/1986 | |
| JP | 3-224371 | 10/1991 | |
| JP | 6-45576 | 2/1994 | |
| JP | 06045576 A * | 2/1994 | |
| JP | 8-335689 | 12/1996 | |

(Continued)

OTHER PUBLICATIONS

"Frame Transfer Area Array Sensor with Vertical Anti-blooming and Novel Readout for Enhanced Performance" Martin J. Kiik et al., IEEE 1997 pp 8.2.1-8.2.4.

*Primary Examiner*—Thai Tran
*Assistant Examiner*—Gary C. Vieaux
(74) *Attorney, Agent, or Firm*—Hamre, Schumann, Mueller & Larson, P.C.

(57) ABSTRACT

In a solid-state imaging device, a plurality of vertical charge transfer paths is arranged at a horizontal pitch A within a photoelectric conversion region, and at a pitch B that is smaller than the pitch A in a portion where the signals are input into the horizontal charger transfer path. A read-out amplifier and a horizontal charge transfer path for receiving signals from vertical charge transfer paths are provided for each photoelectric conversion block into which the photoelectric conversion region has been partitioned. The read-out amplifiers have the same shape and their positional relation is one of parallel displacement in regions that are obtained by changing the pitch of the vertical charge transfer portions. Thus, a solid-state imaging device is achieved that is not so easily influenced by mask misalignments or skewed ion implantation angles, and in which signal read-out at high speeds is possible.

4 Claims, 12 Drawing Sheets

FOREIGN PATENT DOCUMENTS

| | | |
|---|---|---|
| JP | 08335689 A * | 12/1996 |
| JP | 9-148562 | 6/1997 |
| JP | 9-186937 | 7/1997 |
| JP | 11-27589 | 1/1999 |

* cited by examiner

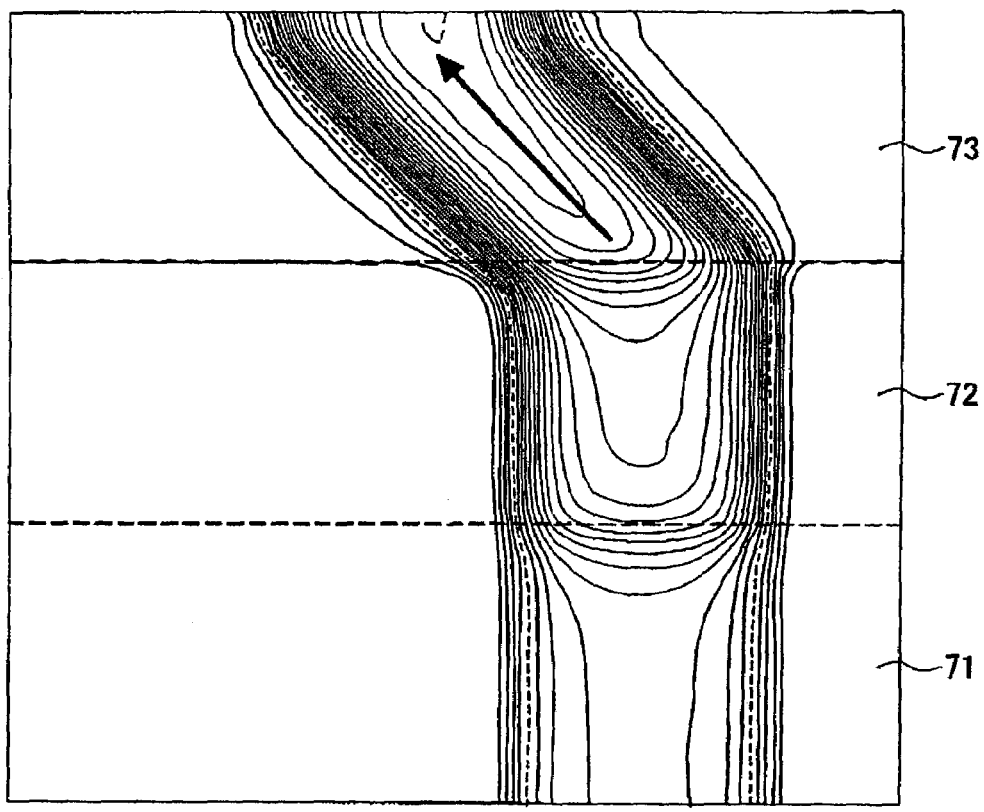
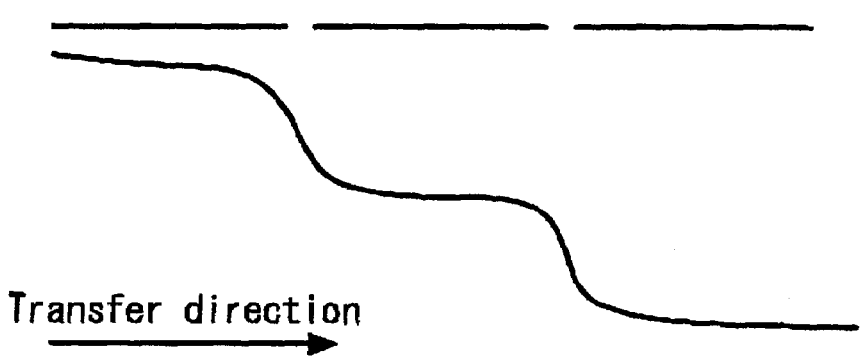
Transfer direction
Reference Figure A (corresponding to Fig. 8A)

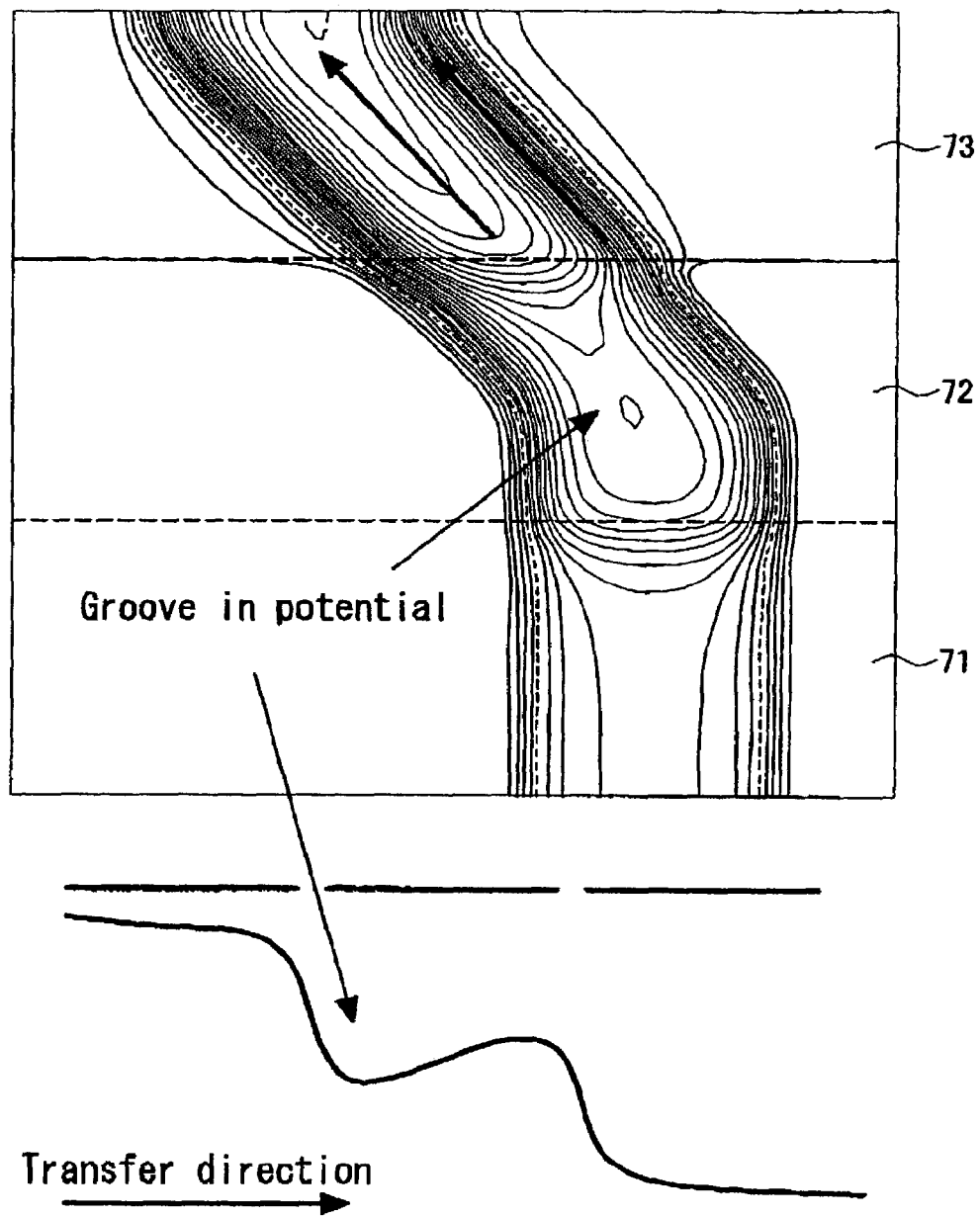
Reference Figure B (corresponding to Fig. 8B)

Parallel Displacement    Mirror Symmetry

Direction of misalignment
or
Direction of implantation skew
←

Direction of misalignment
or
Direction of implantation skew
←

IMAGING DEVICE WITH VERTICAL CHARGE TRANSFER PATHS HAVING APPROPRIATE LENGTHS AND/OR VENT PORTIONS

BACKGROUND OF THE INVENTION

1. Field of the Invention

The present invention relates to solid-state imaging devices and to imaging systems using the same. More particularly, the present invention provides a device structure that is suitable for solid-state imaging devices capable of high-speed read-out.

2. Description of the Related Art

One method of reading out image data at high speeds in an imaging device is to partition the photoelectric conversion region into a plurality of regions, and to read out the charges from these regions in parallel. JP H03-224371A (see FIG. 10), for example, proposes a structure in which the read-out amplifiers are arranged in mirror symmetry (line symmetry). In this solid-state imaging device, signals are output from the pixels arranged in rows and columns in the pixel portions 31 and 32, after having passed through the horizontal charge transfer path 33 and the read-out amplifiers 34 and 35, which are arranged on both ends of the horizontal charge transfer path.

However, when the read-out amplifiers 34 and 35 are arranged in mirror symmetry to one another, their source (S) and drain (D) have to be arranged mirror symmetrically with respect to the gate (G) at the transistor level (see FIG. 11B). Therefore, misalignments occurring during the masking step in the semiconductor manufacturing process are coupled with the influence of injection angle dependencies during the injection of impurities, and it is difficult to manufacture read-out amplifiers with uniform input/output characteristics.

Differences in the characteristics of the read-out amplifiers lead to the problem that blocks can be observed in the image when replaying the image. Moreover, when the data that have been read out are combined and displayed as one image, it is necessary to rearrange the image data, which makes the signal processing troublesome. In the arrangement in FIG. 11A, misalignments during the lithography step have the same influence on different amplifiers, so that they do not lead to differences in the characteristics between amplifiers. However, in the arrangement in FIG. 11B, ion implantation skew and mask misalignments during the manufacturing steps have different effects on different amplifiers, and lead to amplifiers with different characteristics.

SUMMARY OF THE INVENTION

It is therefore an object of the present invention to solve these problems and to provide a structure of a solid-state imaging device that is not so easily influenced by mask misalignments and skewed ion implantation angles during the semiconductor manufacturing process, and in which the signal processing is easy even when signals are read out with a plurality of amplifiers and displayed as one image.

In order to attain these objects, a solid-state imaging device in accordance with the present invention includes a photoelectric conversion region. The photoelectric conversion region has a plurality of photoelectric conversion portions arranged in rows and columns extending in a vertical direction and a horizontal direction, and a plurality of vertical charge transfer paths extending substantially in parallel to the columns of the photoelectric conversion portions. This solid-state imaging device also has a horizontal charge transfer path for receiving signals from the plurality of vertical charge transfer paths. In this solid-state imaging device, the plurality of vertical charge transfer paths is arranged at a horizontal pitch A within the photoelectric conversion region, and at a pitch B that is smaller than the pitch A in a portion where the signals are input into the horizontal charge transfer path.

BRIEF DESCRIPTION OF THE DRAWINGS

FIGS. 8A and 8B are plan views showing examples of the vicinity of the bent portion in the vertical charge transfer paths of the solid-state imaging device of the present invention.

FIG. 11A shows a pair of transistors, whose relative position is one of parallel displacement, and FIG. 11B shows a pair of transistors, whose relative position is one of mirror symmetry (line symmetry). FIGS. 11A and 11B illustrate the differences between these arrangements.

DESCRIPTION OF THE PREFERRED EMBODIMENTS

Figure 11A:
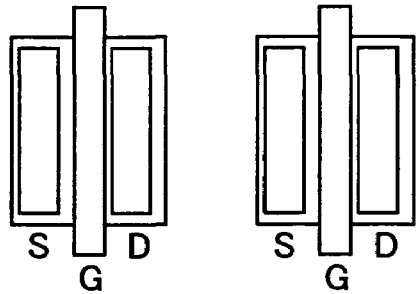
FIGS. 11A and 11B illustrate the differences in the amplifier shape caused by misalignments and skewed ion implantation angles.
Figure 11B:
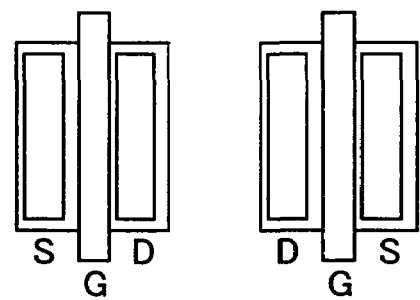

In a solid-state imaging device in accordance with the present invention, the pitch B of the vertical charge transfer paths in the portion where a signal is input into the horizontal charge transfer path is smaller than the pitch A of the vertical charge transfer paths in the photoelectric conversion region (A>B). Consequently, when the number of vertical charge transfer path lines is N, a space S having the width (N−1)×(A−B) is created. This space S can be utilized as the region in which the read-out amplifiers are placed. Thus, if this space S is utilized, then, when the photoelectric conversion region is partitioned into a plurality of sections, and a read-out amplifier is provided for each section, it is possible to arrange this plurality of read-out amplifiers while preserving a positional relation of parallel displacement of the read-out amplifiers with respect to one another. Such a positional arrangement, in which the read-out amplifiers can be shifted by parallel displacement upon one another, is shown in FIG. 11A for example.

With this arrangement, it is possible to suppress the influence of misalignments and skewed impurity implantation angles during manufacture. Moreover, peripheral circuits and the wiring leading thereto can be realized with the same pattern, canceling out differences in the properties of the peripheral circuits and the wiring. Also with regard to the signal processing, the sections of the photoelectric conversion region corresponding to one read-out amp (that is, the photoelectric conversion blocks) all have the same shape, and can be arranged so that the horizontal read-out direction is the same for all corresponding pixels. Therefore, it is possible to obtain a solid-state imaging device, in which the troublesome data rearranging, which is necessary when the pixels are arranged in mirror symmetry, is obviated.

In a preferable embodiment of the present invention, a read-out amplifier and a horizontal charge transfer path for receiving signals from the charge transfer paths are provided for each section into which the photoelectric conversion region is partitioned along the vertical direction (in other words, for each photoelectric conversion block). In this case, it is preferable that the read-out amplifier and the horizontal charge transfer path for receiving signals from the vertical charge transfer paths are provided at a horizontal spacing that is not larger than the width of the section into which the photoelectric conversion region is partitioned, utilizing the aforementioned space S. This preferable embodiment achieves a structure, in which there is no limitation on the number of photoelectric conversion blocks that can be arranged in the horizontal direction. More specifically, a plurality of solid-state imaging blocks of substantially the same shape can be arranged next to one another in horizontal direction, each solid-state imaging block including one of the sections into which the photoelectric conversion region has been partitioned (photoelectric conversion block), one horizontal transfer path for receiving signals from this section, and one read-out amplifier. This makes it easier to achieve a uniform image.

It is also advantageous that the vertical charge transfer paths are arranged at the horizontal pitch A also at the border between photoelectric conversion blocks, because this can cancel image distortions, for example.

It is preferable that the horizontal width of the vertical charge transfer paths is substantially constant from a portion at the photoelectric conversion region to a portion at the horizontal charge transfer portion, but it is also possible that the horizontal width of the vertical charge transfer paths increases gradually or step-like from a portion at the photoelectric conversion region to a portion at the horizontal charge transfer portion.

In a typical embodiment of the vertical charge transfer portions, bent portions (portions where the vertical charge transfer portions form an angle) can be observed when viewed from above. In this case, there is the possibility of transfer losses in the bent portions, and these transfer losses can be suppressed with various methods.

For example, it is possible to arrange a plurality of transfer electrodes above the vertical charge transfer paths and wire them such that, at least in the bent portions of the vertical charge transfer paths, transfer driving pulses can be applied independently from other portions of the vertical charge transfer paths. With this arrangement, it is possible to apply suitable transfer pulses independently to the bent portions.

It is also preferable to arrange a plurality of transfer electrodes such that bent portions of the vertical charge transfer paths are generally arranged below positions between the transfer electrodes, rather than below the transfer electrodes. If, however, the bent portions are positioned below predetermined transfer electrodes, then it is preferable that a transfer path length on which a transfer driving pulse is applied with said predetermined transfer electrodes is shorter than a transfer path length on which the transfer driving pulse is applied with transfer electrodes that are adjacent to said predetermined transfer electrodes.

It is preferable that the largest bending angle in the bent portions is not more than 45°. If a group of vertical charge transfer paths is squeezed together from both sides toward the center while gradually reducing the pitch of the plurality of vertical charge transfer paths, then the bending angle becomes largest at the outermost vertical charge transfer paths. In photoelectric conversion blocks with this typical embodiment, it is preferable that the bending angle at the outermost vertical charge transfer paths is not more than 45°.

The following is a detailed description of the embodiments of the present invention, with reference to FIGS. 1 to 8.

First Embodiment

Figure 1:
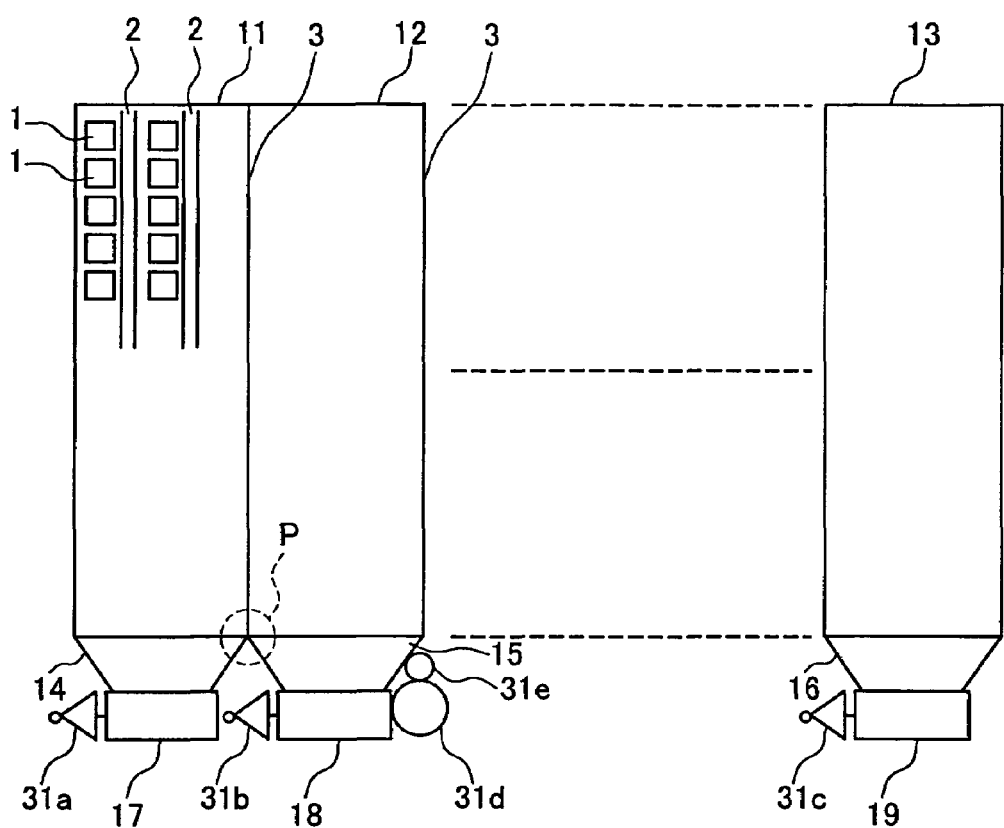
FIG. 1 shows a configuration of the solid-state imaging device in accordance with the present invention.

FIG. 1 shows the configuration of a CCD-type solid-state imaging device in accordance with a first embodiment of the present invention. In this solid-state imaging device, photodiodes (photoelectric conversion portions) 1 are formed in photoelectric conversion blocks 11, 12, . . . , 13, in the form of rows and columns (i.e. a matrix or two-dimensional array). Between the columns of photodiodes, vertical charge transfer paths (VCCD) 2 extend along the columns.

In this solid-state imaging device, vertical/horizontal conversion portions (V-H conversion portions) 14, 15, . . . , 16 are formed between the photoelectric conversion blocks 11, 12, . . . 13 and the horizontal charge transfer paths (HCCD) 17, 18, . . . , 19. The horizontal charge transfer paths are connected to read-out amplifiers 31a, 31b, . . . , 31c. In this arrangement, the read-out amplifiers are placed in spaces that result from the tapering of the vertical CCDs, so that it is possible to place them directly adjacent to the last stage of the horizontal transfer paths. Thus, it is possible to suppress the parasitic capacitance of the FDAs (floating diffusion amplifies) to a minimum, which is advantageous for making the amplifiers more sensitive. After passing from the vertical charge transfer paths through the horizontal charge transfer paths, the signal charge produced in the photoelectric conversion blocks is transferred to these read-out amplifiers.

Inside the photoelectric conversion blocks, the vertical charge transfer paths 2 of this solid-state imaging device are arranged preserving the same spacing with respect to the horizontal direction. Also at the border (joint) portions 3 between the blocks, the horizontal spacing between the vertical charge transfer paths is held constant. Consequently, in this solid-state imaging device, the horizontal spacing between the vertical charge transfer paths is the same throughout the entire photoelectric conversion region. On the other hand, the spacing of the horizontal charge transfer paths in the V-H conversion portions 14, 15, . . . , 16 is not constant.

Figure 2:
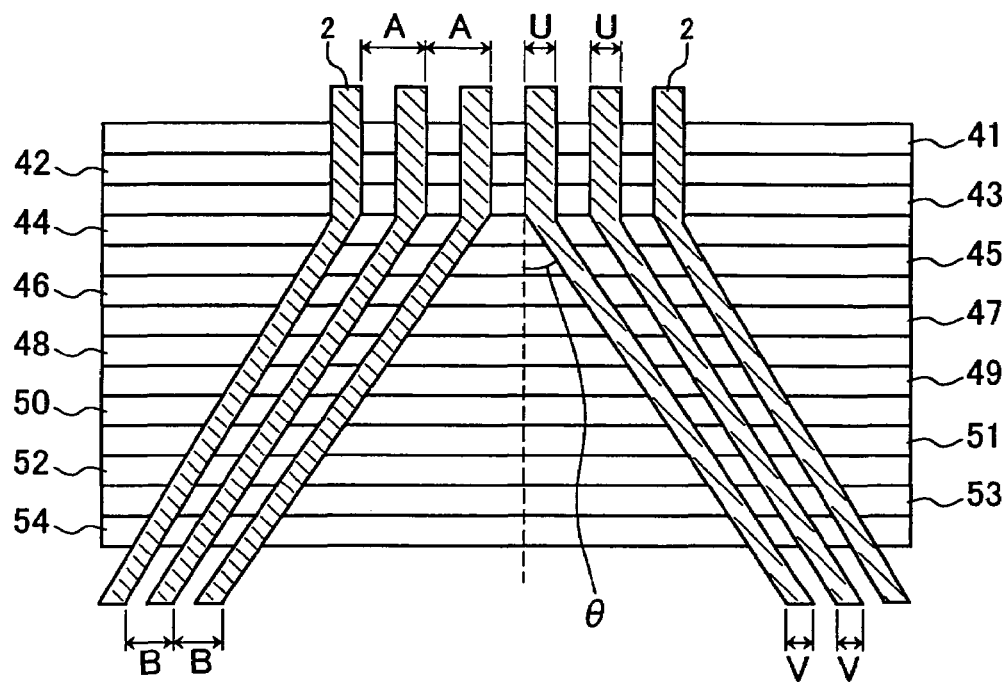
FIG. 2 shows a magnification of the region P in FIG. 1.

FIG. 2 shows a magnification of the vicinity of the region P in FIG. 1. In the photoelectric conversion region, the vertical charge transfer paths 2 are lined up with a pitch A. At the end where they contact the horizontal charge transfer paths, the vertical charge transfer paths 2 are lined up with a pitch B (A>B). The pitch B should be, for example, 40 to 80% narrower than the pitch A. Applying a driving pulse to the transfer electrodes 41 to 54 transfers the signal charges in the vertical charge transfer paths sequentially downward in the drawing. The transfer electrodes are made, for example, of polycrystalline silicon films.

When the vertical charge transfer paths bend abruptly, there is the danger of transfer losses. Preferably, the bending degree θ is not higher than 45°. In addition, the wiring should be such that independent pulses can be applied to the portion where the transfer paths are bent, so that transfer losses do not occur at this portion. It is preferable that the electrode structure in the arrangement in FIG. 2 includes such wiring that pulses that are independent from the other electrodes can be applied to at least the electrodes 43 and 44.

In this manner, empty regions 31d are created by utilizing the trapezoid V-H conversion portions, in which the vertical charge transfer paths are increasingly constricted toward the horizontal charge transfer paths arranged below them in the drawing, and the amplifiers can be arranged in these empty regions. In this solid-state imaging device, the charge transfer direction is the same for all horizontal charge transfer paths. Thus, it is possible to arrange amplifiers with the same shape at the stage behind the transfer path, with the same positional relation of their structural members (see FIG. 11A).

In this solid-state imaging device, when one region with which signals are picked up, for example the region made up of the photoelectric conversion region 11, the V-H conversion portion 14, the horizontal charge transfer path 17 and the read-out amplifier 31a is regarded as one solid-state imaging block, then the entire device is made up of solid-state imaging blocks arranged adjacently in the horizontal direction. These solid-state imaging blocks have the same shape and preserve a positional relation of parallel displacement with respect to one another. Except for the wiring pattern to the pads on the chip, which connect the solid-state imaging blocks to the outside, these solid-state imaging blocks can be provided with basically the same shape. Consequently, this arrangement is very advantageous in that it preserves the uniformity of the image.

The solid-state imaging device obtained in this manner is not very susceptible to the influence of mask misalignments and skewed ion implantation angles during the semiconductor manufacturing process, and the signal processing for reading out signals with a plurality of amplifiers and displaying them as one image is simple.

In this embodiment, all elements are arranged in a streamlined manner, but it is possible to widen the region where the amplifiers can be placed even further by extending the amplifiers into the regions 31e used for forming the transfer electrodes 41 to 54. These regions 31e can be utilized with the following embodiment.

Second Embodiment

Figure 3:
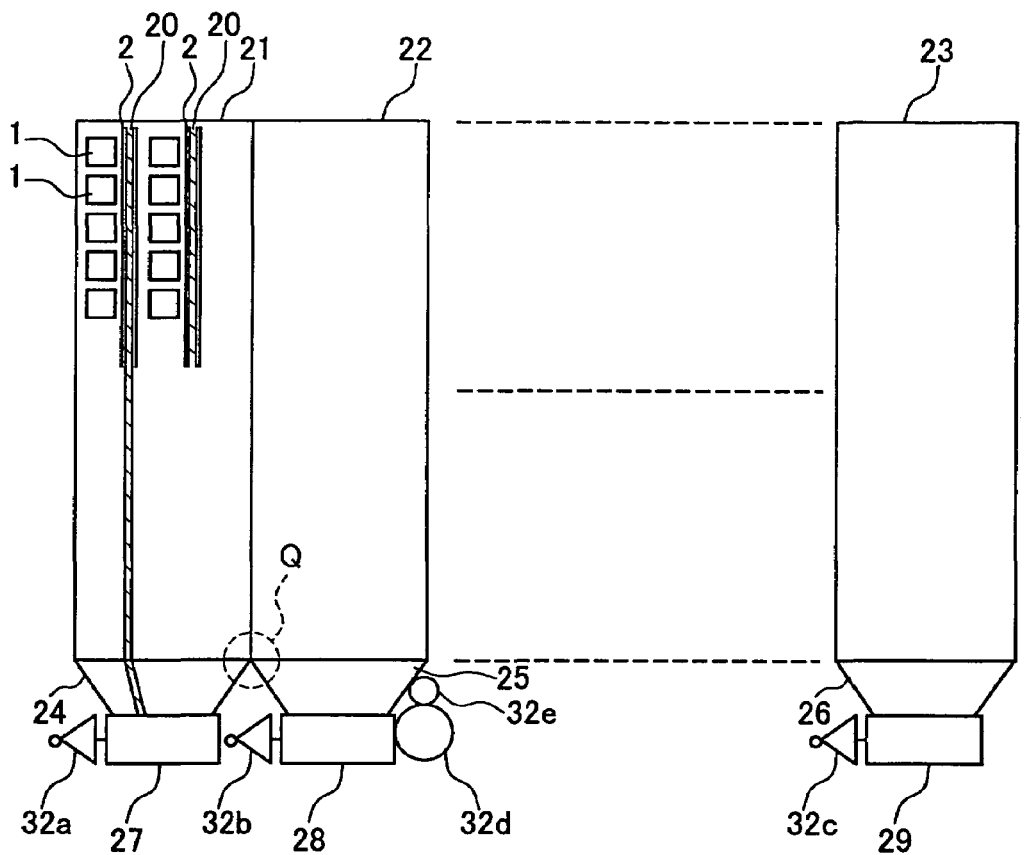
FIG. 3 shows another configuration of a solid-state imaging device in accordance with the present invention.

FIG. 3 shows the configuration of a CCD-type solid-state imaging device in accordance with a second embodiment of the present invention. Also in this solid-state imaging device, as in the first embodiment, the photodiodes 1 and the vertical charge transfer paths 2 are arranged in photoelectric conversion blocks 21, 22, . . . , 23, and horizontal charge transfer paths 27, 28, . . . , 29 and read-out amplifiers 32a, 32b . . . , 32c are provided for each of these photoelectric conversion blocks 21, 22, . . . ,23. V-H conversion portions 24, 25, . . . , 26 are formed between the photoelectric conversion blocks and the horizontal transfer electrodes.

In this solid-state imaging device, conducting lines 20 are formed along the vertical charge transfer paths 2. These conducting lines 20 feed a driving pulse to the lower transfer electrodes (not shown in the drawing), through contact holes that are formed as appropriate. The contact holes are formed at predetermined spacings corresponding to the driving pattern that is used.

Figure 4:
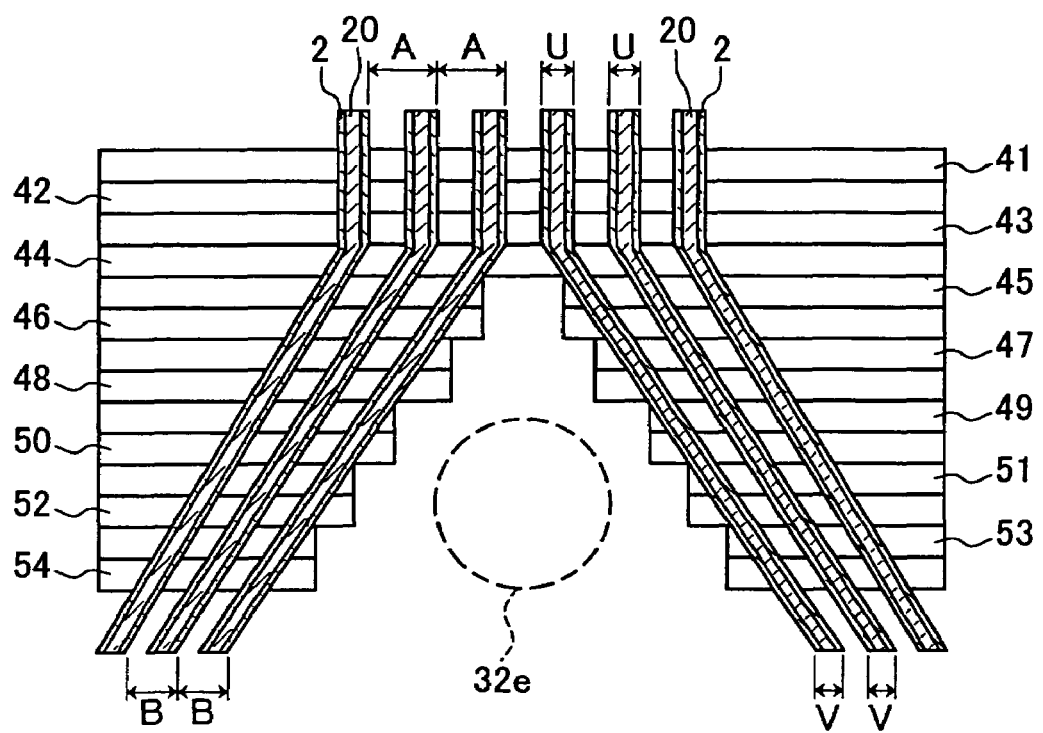
FIG. 4 shows a magnification of the region Q in FIG. 2.

As shown in FIG. 4, which is a magnification of the vicinity of the region Q in FIG. 3, also in the V-H conversion portion, the conducting lines 20 are arranged along the vertical charge transfer paths 2. Therefore, it is not necessary to link the transfer electrodes 41 to 54 to one another horizontally, and the transfer electrodes 45 to 54 in the V-H conversion portion of the different solid-state imaging blocks can be formed separately. Consequently, using this embodiment, the regions 32e, which were dead space in the first embodiment, can be utilized together with the regions 32d for the read-out amplifiers.

The foregoing is a description of two embodiments for a solid-state imaging device of the present invention, and the following is an explanation of even more preferable embodiments and application examples of such a solid-state imaging device.

Figure 5A:
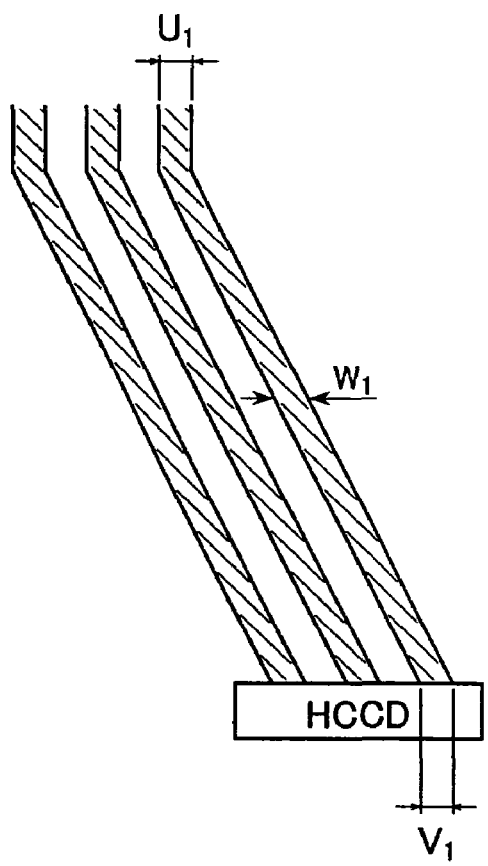
FIGS. 5A and 5B are plan views illustrating the width of the vertical charge transfer paths.

To prevent the so-called "narrow channel effect", the charge transfer paths in the V-H conversion portion should be set to the same width. Referring to FIG. 5A, the width $U_1$ of the transfer paths in the photoelectric conversion region is the same as the width $V_1$ where the transfer paths are connected to the horizontal charge transfer paths ($U_1=V_1$). It is also equal to the width $W_1$ at any location in the V-H conversion portion ($U_1=W_1=V_1$).

Figure 5B:
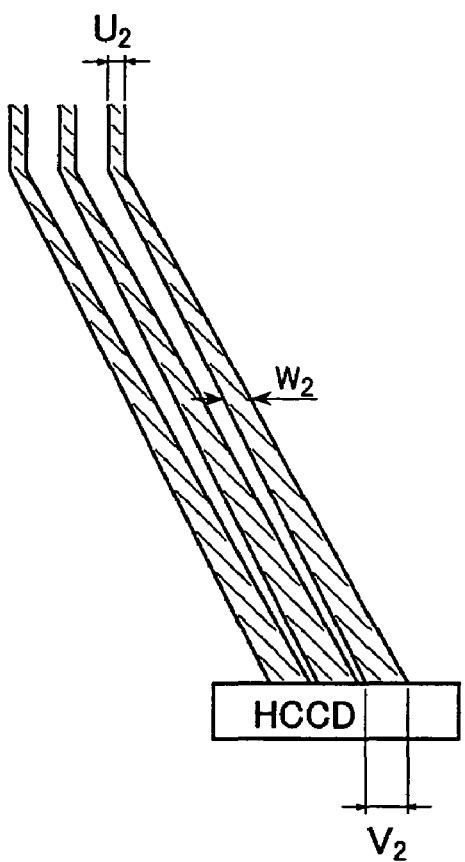

To prevent the narrow channel effect, it is also possible to widen the width of the transfer paths increasingly from the photoelectric conversion region to the horizontal charge transfer paths as shown in FIG. 5B ($U_2<W_2<V_2$). FIG. 5B shows an example, in which the width of the transfer paths is widened gradually, but it is also possible to widen the transfer paths in a step-wise fashion.

Thus, it is preferable to lay out the transfer paths so as to establish the relation $U \leq V$. More specifically, it is preferable that V is about 1.0 to 1.5 times as large as U.

Figure 6:
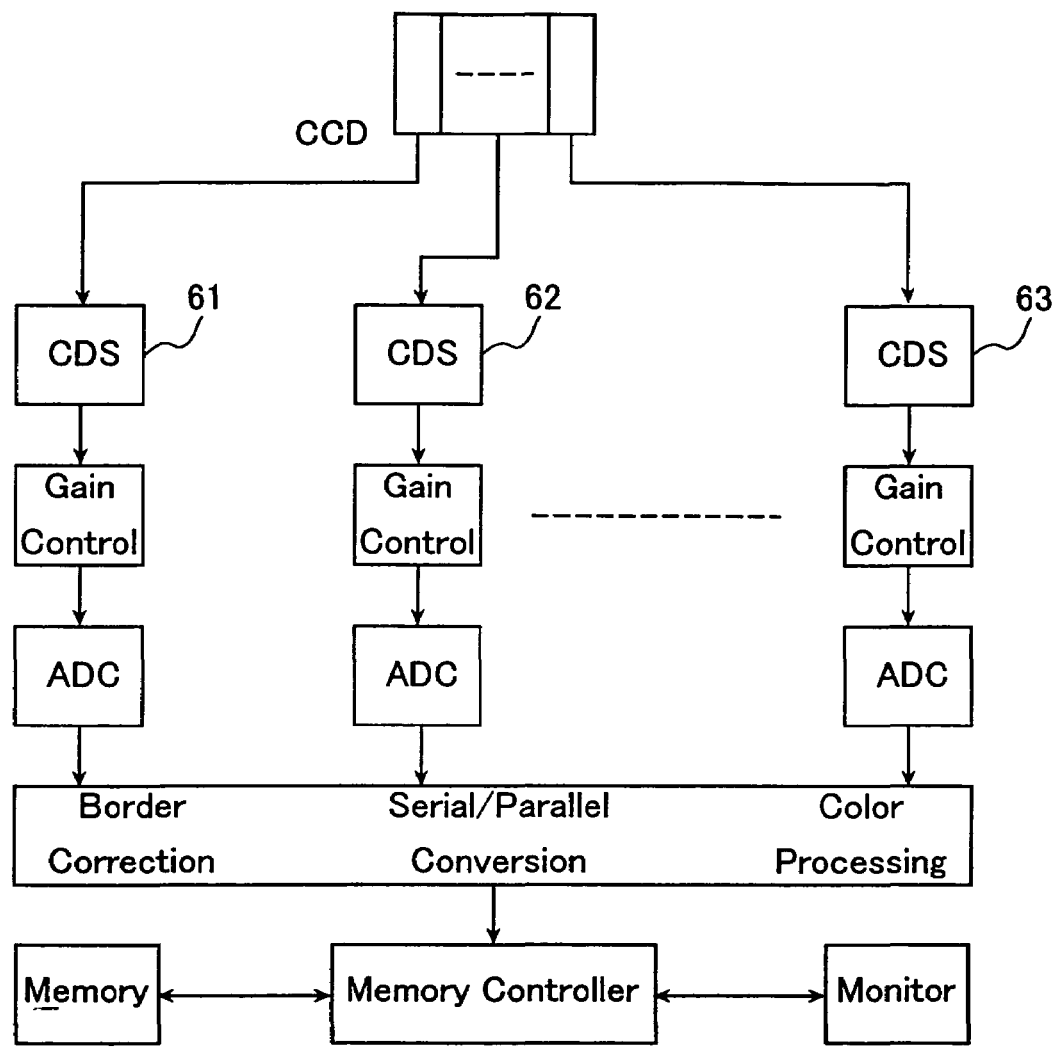
FIG. 6 is a block diagram showing a configuration of the imaging system in accordance with the present invention.

FIG. 6 shows an example of an imaging system using this solid-state imaging device. Signals that have been read in in parallel are transmitted from a plurality of read-in amplifiers over the transmission paths 61, 62, . . . , 63, and are subjected to CDS (correlated double sampling), gain control, and ADC (analog/digital conversion). Then, correction of the joint portion between different read-out amplifiers is performed, as well as the serial conversion and color processing of the parallel data that have been read out in parallel, and the data are displayed on a monitor or stored in a memory, after passing through a memory controller. Thus, a uniform image without borders is obtained.

Figure 7:
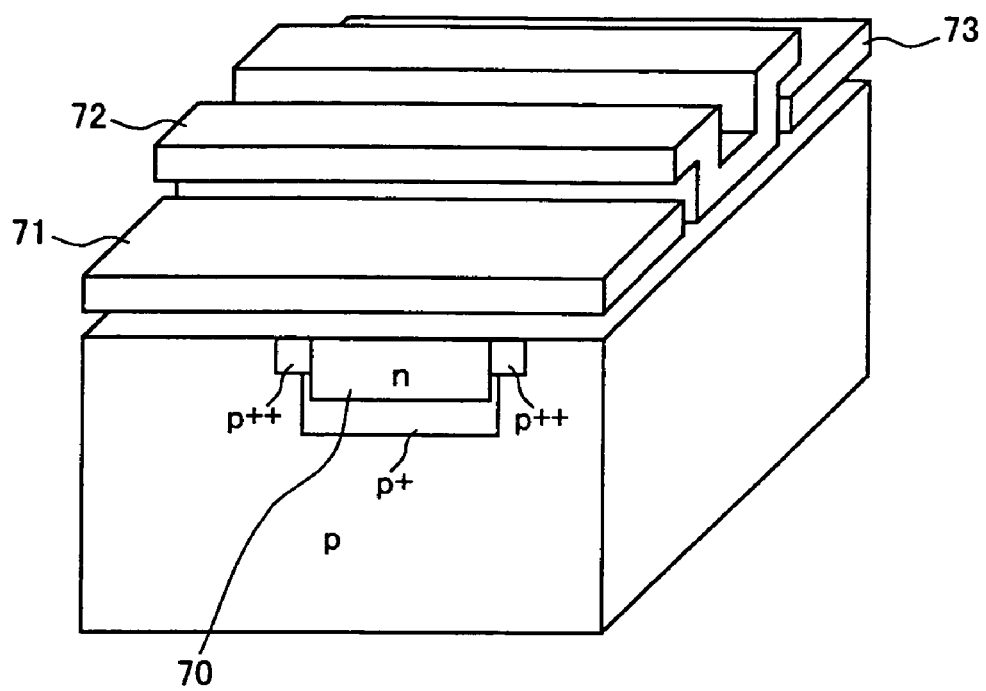
FIG. 7 is a perspective view of a vertical charge transfer path of the solid-state imaging device of the present invention and the structure arranged on top of it.

FIG. 7 is a cross-sectional perspective view of the vertical charge transfer path 70 of the above-described solid-state imaging device and the vertical transfer electrodes 71, 72 and 73 arranged on top of it. When viewed from above, between the transfer electrodes 72 and 73, there is a bending point F with a bending angle θ in the vertical charge transfer path 70 with the width W (see FIG. 8A). When the transfer path bends like this at a position between electrodes, transfer losses can be avoided. On the other hand, when the bending point F of the transfer path 70 is arranged below the transfer electrode 72 (see FIG. 8B), transfer losses tend to occur below this transfer electrode 72. FIG. 7 shows an example in which the transfer electrodes 71 to 73 are made of a two-layer polysilicon film, but it is also possible to provide the electrodes with a layering structure of three or more layers. Furthermore, the layering order of the transfer electrodes is not limited to the example shown in FIG. 7, and it is also possible to form the transfer electrode 72 on the adjacent transfer electrodes 71 and 73.

Figure 9:
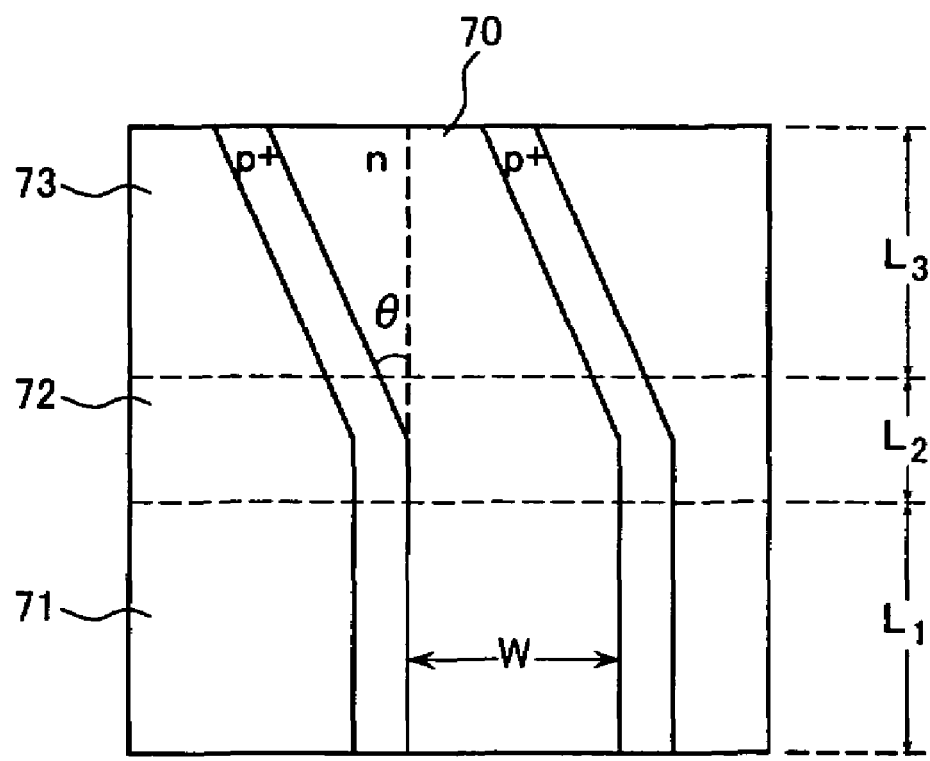
FIG. 9 is a plan view showing another example of the vicinity of the bent portion in the vertical charge transfer paths of the solid-state imaging device of the present invention.
Figure 10:
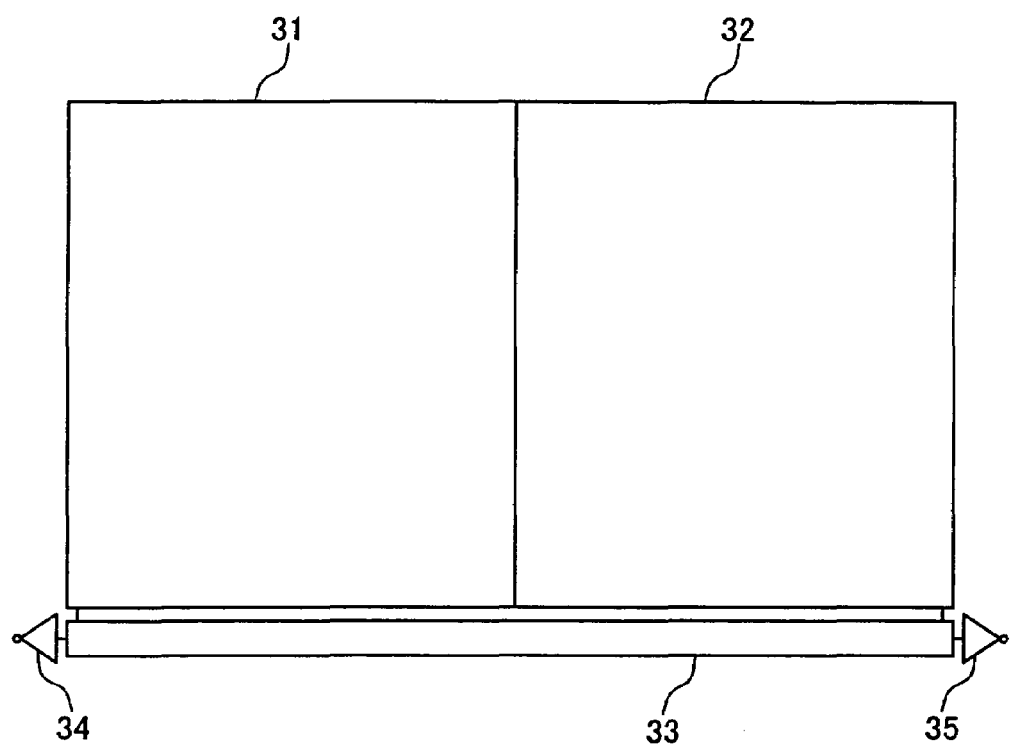
FIG. 10 shows the configuration of a conventional solid-state imaging device.

However, even when the bending point is formed directly below the electrode as shown in FIG. 9, transfer losses can be suppressed if the transfer packets are performed, for example, by so-called ⅔ transfer, and the gate length of the transfer electrode 72 is made shorter than that of the two adjacent electrodes ($L_1>L_2$, $L_3>L_2$). To be specific, when the gate width W is 1 to 3 μm, it is preferable that $L_2$ is about 1 μm shorter than the length L of the other transfer electrodes. To ensure the charge capacity, it is preferable that, again, when the gate width W is 1 to 3 μm, and $L_1$ and $L_3$ are about 1 μm longer than the length L of the further transfer electrodes.

Thus, in accordance with the present invention, a solid-state imaging device is provided, in which signal charges can be read out at high speeds by parallel read-out, and in which variations among the amplifier input/output characteristics due to mask misalignments or dependencies on the implantation angle of doping impurities during the semiconductor manufacturing process can be suppressed. Moreover, the solid-state imaging blocks, which include the read-out amplifiers, are of the same shape and can be arranged in parallel to one another, so that when displaying one image, it is possible to omit the rearranging of the data, which is necessary when reading out with mirror symmetry, therefore making the signal processing easier.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A solid-state imaging device, comprising:
a photoelectric conversion region including:
   a plurality of photoelectric conversion portions arranged in rows and columns extending in a vertical direction and a horizontal direction; and
   a plurality of vertical charge transfer paths extending substantially in parallel to the columns of the photoelectric conversion portions;
a plurality of horizontal charge transfer paths for receiving signals from the respective vertical charge transfer paths; and
a plurality of read-out amplifiers for receiving signals from the respective horizontal charge transfer path,
wherein the plurality of vertical charge transfer paths is arranged at a horizontal pitch A within the photoelectric conversion region, and at a pitch B that is smaller than the pitch A in a portion where the signals are input into the horizontal charge transfer path, the pitch B reducing gradually from the photoelectric conversion region toward the horizontal charge transfer path so that the vertical charge transfer paths are squeezed together,
the read-out amplifier and the horizontal charge transfer path are provided for each section into which the photoelectric conversion region is partitioned along the vertical direction, so as to be provide at a horizontal spacing that is not large than the width of the section,
each of the readout amplifiers is placed in a space that results from the squeezing of the vertical charge transfer paths, so as to be placed directly adjacent to the last stage of the horizontal transfer path, and
a plurality of transfer electrodes are arranged above the vertical charge transfer paths such that bent portions of the vertical charge transfer paths are positioned below locations between the adjacent transfer electrodes.

2. A solid-state imaging device, comprising:
a photoelectric conversion region including:
   a plurality of photoelectric conversion portions arranged in rows and columns extending in a vertical direction and a horizontal direction; and
   a plurality of vertical charge transfer paths extending substantially in parallel to the columns of the photoelectric conversion portions;
a plurality of horizontal charge transfer paths for receiving signals from the respective vertical charge transfer paths; and
a plurality of read-out amplifiers for receiving signals from the respective horizontal charge transfer path,
wherein the plurality of vertical charge transfer paths is arranged at a horizontal pitch A within the photoelectric conversion region, and at a pitch B that is smaller than the pitch A in a portion where the signals are input into the horizontal charge transfer path, the pitch B reducing gradually from the photoelectric conversion region toward the horizontal charge transfer path so that the vertical charge transfer paths are squeezed together,
the read-out amplifier and the horizontal charge transfer path are provided for each section into which the photoelectric conversion region is partitioned along the vertical direction, so as to be provide at a horizontal spacing that is not large than the width of the section,
each of the read-out amplifiers is placed in a space that results from the squeezing of the vertical charge transfer paths, so as to be placed directly adjacent to the last stage of the horizontal transfer path,
a plurality of transfer electrodes are arranged above the vertical charge transfer paths,
bent portions of the vertical charge transfer paths are positioned below predetermined transfer electrodes; and
a transfer path length on which a transfer driving pulse is applied with said predetermined transfer electrodes is shorter than a transfer path length on which the transfer driving pulse is applied with transfer electrodes that are adjacent to said predetermined transfer electrodes.

3. An imaging system, comprising:
the solid-state imaging device of claim 1; and
a signal processing portion that synthesizes output from the read-out amplifiers of the sections of the solid-state imaging device, and corrects the image at joint portions corresponding to portions where the sections border with one another, so as to display one image.

4. An imaging system, comprising:
the solid-state imaging device of claim 2; and
a signal processing portion that synthesizes output from the read-out amplifiers of the sections of the solid-state imaging device, and corrects the image at joint portions corresponding to portions where the sections border with one another, so as to display one image.

* * * * *

UNITED STATES PATENT AND TRADEMARK OFFICE
CERTIFICATE OF CORRECTION

PATENT NO. : 6,985,182 B1 Page 1 of 1
APPLICATION NO. : 09/717758
DATED : January 10, 2006
INVENTOR(S) : Morinaka et al.

It is certified that error appears in the above-identified patent and that said Letters Patent is hereby corrected as shown below:

Column 7, line 61(claim 1): "provide" should read --provided--
Column 7, line 62(claim 1): "large" should read --larger--
Column 8, line 32(claim 2): "provide" should read --provided--
Column 8, line 33(claim 2): "large" should read --larger--

Signed and Sealed this

Sixteenth Day of January, 2007

JON W. DUDAS
*Director of the United States Patent and Trademark Office*